(12) United States Patent
Mallett et al.

(10) Patent No.: US 7,248,047 B2
(45) Date of Patent: Jul. 24, 2007

(54) SHIELDING FOR MOBILE MR SYSTEMS

(75) Inventors: Michael John Disney Mallett, Witney (GB); Michael Pietsch, Oneonta, NY (US); Michael Alan Senseney, Otego, NY (US); Joshua Andrew Simmers, New Berlin, NY (US); Stephen Paul Trowell, Finstock (GB); Neil Charles Tigwell, Witney (GB); Jeremy Francis Williams, Witney (GB); Seth Michael DeMarrais, Oneonta, NY (US)

(73) Assignees: Siemens Magnet Technology Ltd., Witney (GB); Siemens Medical Solutions USA, Inc, Oneonta, NY (US)

( * ) Notice: Subject to any disclaimer, the term of this patent is extended or adjusted under 35 U.S.C. 154(b) by 0 days.

(21) Appl. No.: 11/206,815

(22) Filed: Aug. 19, 2005

(65) Prior Publication Data

US 2006/0186884 A1    Aug. 24, 2006

(30) Foreign Application Priority Data

Feb. 22, 2005    (GB) .................................. 0503622.3

(51) Int. Cl.
*G01V 3/00*    (2006.01)
(52) U.S. Cl. ..................... 324/318; 335/301; 335/304
(58) Field of Classification Search ............... 324/318; 335/301, 304
See application file for complete search history.

(56) References Cited

U.S. PATENT DOCUMENTS

| 4,646,046 | A | * | 2/1987 | Vavrek et al. | 335/301 |
|---|---|---|---|---|---|
| 4,890,083 | A | * | 12/1989 | Trenkler et al. | 335/301 |
| 5,001,448 | A | * | 3/1991 | Srivastava et al. | 335/301 |
| 5,012,217 | A | * | 4/1991 | Palkovich et al. | 335/301 |
| 5,128,643 | A | * | 7/1992 | Newman | 335/301 |
| 6,317,618 | B1 | * | 11/2001 | Livni et al. | 600/410 |
| 6,882,547 | B2 | * | 4/2005 | Arz | 361/816 |
| 6,946,939 | B2 | * | 9/2005 | Doi | 335/296 |
| 2004/0251901 | A1 | * | 12/2004 | Tsuda et al. | 324/318 |
| 2005/0162249 | A1 | * | 7/2005 | Simola | 335/301 |

* cited by examiner

*Primary Examiner*—Brij Shrivastav
*Assistant Examiner*—Megann E. Vaughn
(74) *Attorney, Agent, or Firm*—Crowell & Moring LLP

(57) ABSTRACT

A trailer for housing a mobile MRI system has magnetic shielding in the form of a plurality of sheets of magnetic material which are supported within the trailer, by a rigid supporting structure or frame. The layers are arranged in a stacked or laminar configuration with the laterally longest layer disposed inward of the remaining layers, such that the width of the gap between that layer and the exterior walls of the trailer at the lateral extremities of the shielding is greater than its width in a central area. The rigid frame maintains the gap and prevents contacting of the shielding and the trailer walls.

17 Claims, 5 Drawing Sheets

SHIELDING FOR MOBILE MR SYSTEMS

BACKGROUND OF THE INVENTION

The present invention is directed to a magnetic shielding arrangement for a mobile MRI system which is mounted in a transportable housing, such as a trailer or prefabricated structure.

Magnetic shielding of a trailer for carrying a mobile MRI (magnetic resonance imaging) system must meet the following criteria: it must contain the magnetic field in accordance with applicable regulations for stray field; adherence to the static site shim specifications must be maintained; and the trailer shielding must not compromise the short-term field stability of the MRI system through bulk movement of the shield.

Measurements of field strength for a known MRI system installed in a mobile trailer indicated that the system suffered from field instabilities, resulting from movement of the shielding steel mounted to the walls of the trailer. In particular, temporal effects on the magnetic field have been attributed to movement of the shielding steel caused by differential thermal expansion across the trailer—differences in expansion coefficients between the outer walls and shield steel—and mechanical wind coupling. All such effects can be increased due to twisting of the trailer when mounted on uneven ground. Such effects are known to limit the performance of such mobile MRI systems.

One object of the present invention is therefore to provide magnetic shielding for a trailer, or other deformable housing such as a prefabricated building, for housing an MRI system, which meets all of the above requirements.

Another object of the invention is to provide magnetic shielding for an MRI system based on, and a deformable housing for, an MRI system, with significant improvements over conventional designs.

Still another object of the invention is to provide a transportable MRI system and housing, in which the MRI system exhibits improved magnetic field stability in the case of deformation of the housing due to the effects of terrain and the environment.

These and other objects and advantages are achieved by the shielding arrangement according to the invention, in which in order to de-couple the shielding from the trailer walls and roof, the trailer is constructed with the shielding mounted to a stiff structure such as a rigid support frame, independent from the outer walls. In addition, in a preferred embodiment of the invention, the arrangement of the steel shielding layers is reversed compared to conventional shielding, in a manner explained hereinafter.

To determine the effectiveness of these measures, the inventors first measured the movement of the magnetic shielding of an MRI system having conventional shielding mounted to the walls of a road trailer, and correlated this movement to the magnetic field drift. The system according to the invention was then tested, and it was shown that the field stability had been improved by a factor of approximately twenty-five over previous measurements (conventional shielding according to the prior art), and was inside the static installation specification for field stability of drift. Measurements indicated that the mobile system had no imaging performance limitations compared to a similar system installed at a static site.

Other objects, advantages and novel features of the present invention will become apparent from the following detailed description of the invention when considered in conjunction with the accompanying drawings.

DETAILED DESCRIPTION OF THE INVENTION

Figure 1:
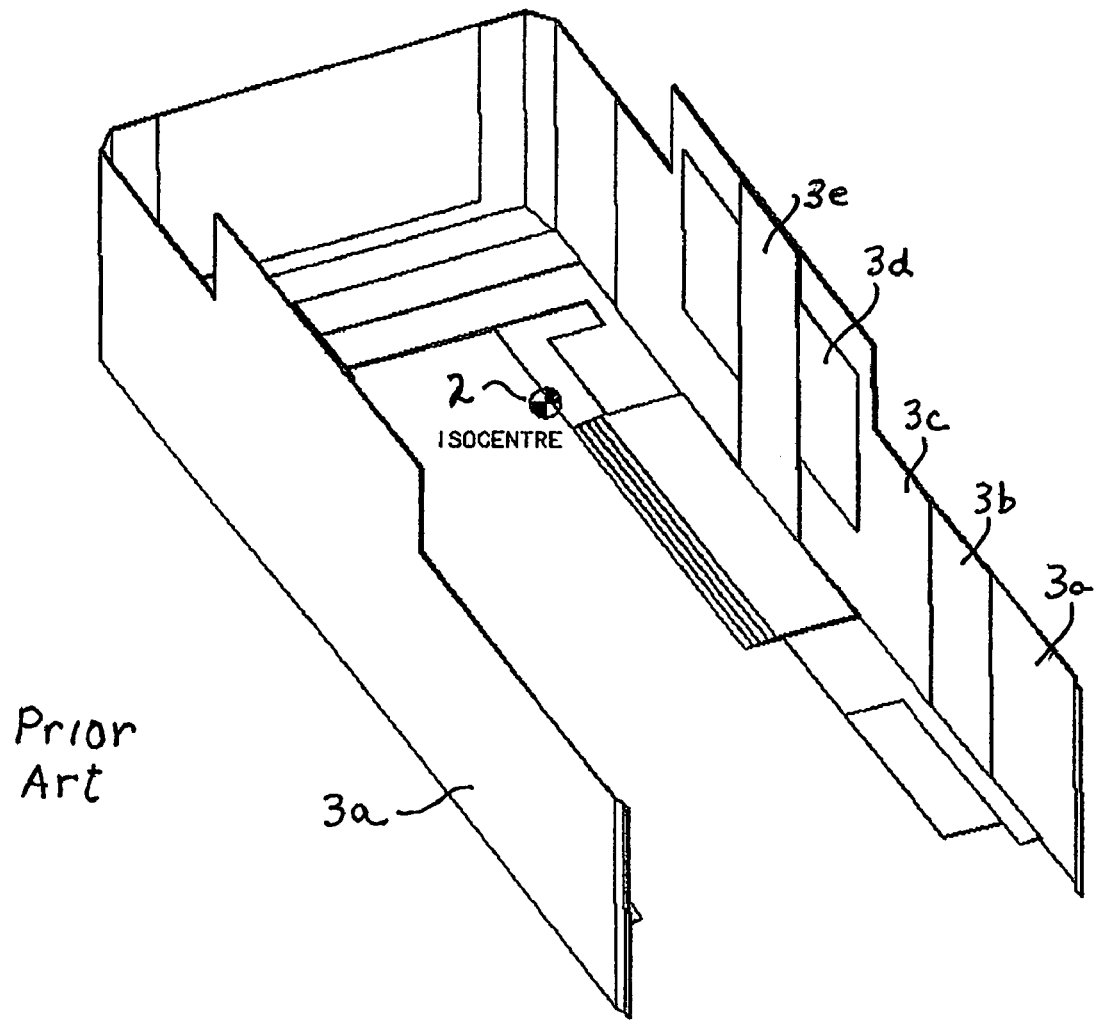
FIG. 1 shows an example of conventional shielding layer arrangement.

FIG. 1 is a schematic depiction of a conventional magnetic shielding structure 1 for a trailer (not shown) which houses a mobile MRI system (not shown). (For simplicity, and to facilitate understanding, only a portion of the overall shielding is illustrated, in broken away form.) The isocenter 2 of the strong magnetic field generated by the MRI system is situated in approximately a center portion of the interior volume of the trailer and the shielding. The function of the shielding is to contain the magnetic field within the trailer, and to prevent, to the greatest extent possible, its propagation outside the trailer walls (not shown).

As can be seen in FIG. 1, the conventional shielding arrangement includes a plurality of shielding layers of a ferromagnetic material, which are "stacked" in the inward direction, in layers of successively smaller lateral size, (with the lateral extent decreasing within the stack toward the midsection of the enclosure). As shown schematically in FIG. 2, this arrangement creates a magnetic shield whose thickness is greatest in the midsection of the trailer where the isocenter of the magnetic field is positioned, and where the greatest density of stray magnetic flux would normally be encountered. The lateral extent of the layers is optimized in order to minimize the total mass of the shielding.

Figure 2:
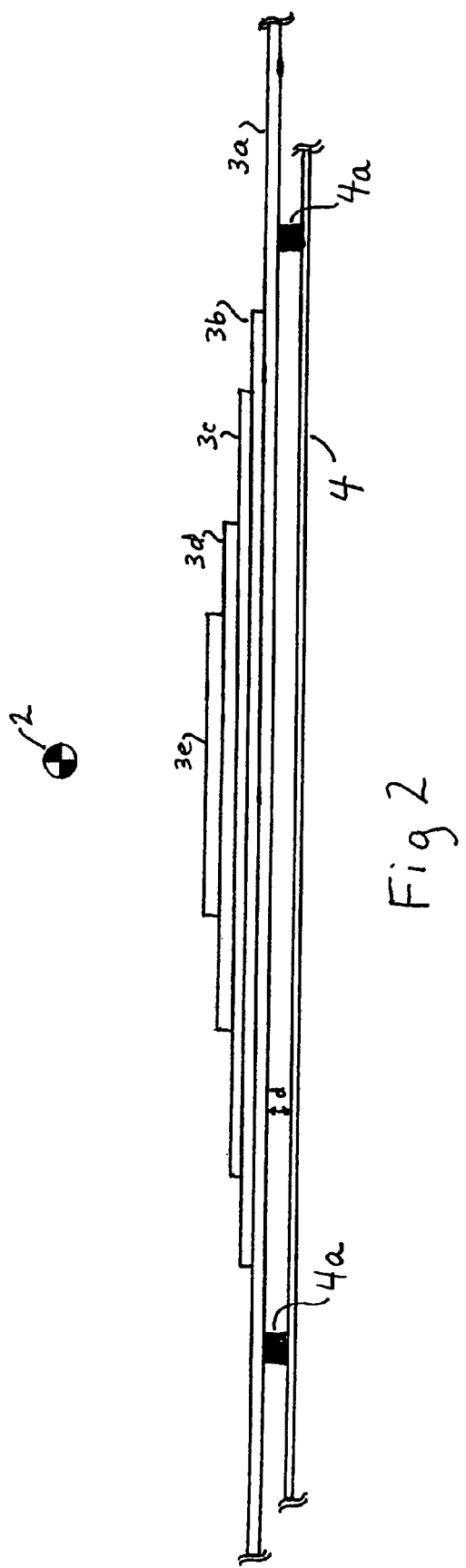
FIG. 2 is a cross sectional schematic view of the prior art layer structure of FIG. 1.

FIG. 2 is a cross sectional schematic top view of the shielding arrangement of FIG. 1, and shows the layers of the magnetic shielding material 3a–3e along a side wall of the trailer 4 of FIG. 1. Because the layers are stacked in "pyramid" fashion, with the smallest layer facing the interior of the trailer, the layer 3a which faces the outer wall 4 of the trailer is flat or planar, and is supported by the outer wall, typically by rigid mountings 4a, at a uniformly narrow distance d along its entire length. As noted previously, the result of this arrangement, with the shielding supported in close proximity to the outer walls of the trailer, is that the isolation between the outer walls of the trailer and the magnetic shield is easily compromised whenever the trailer is subjected to torsional loads due to placement on uneven terrain. Under such conditions, external forces (such as wind or thermal expansion effects) on the outer walls 4 are transmitted directly to the shielding.

Figure 3:
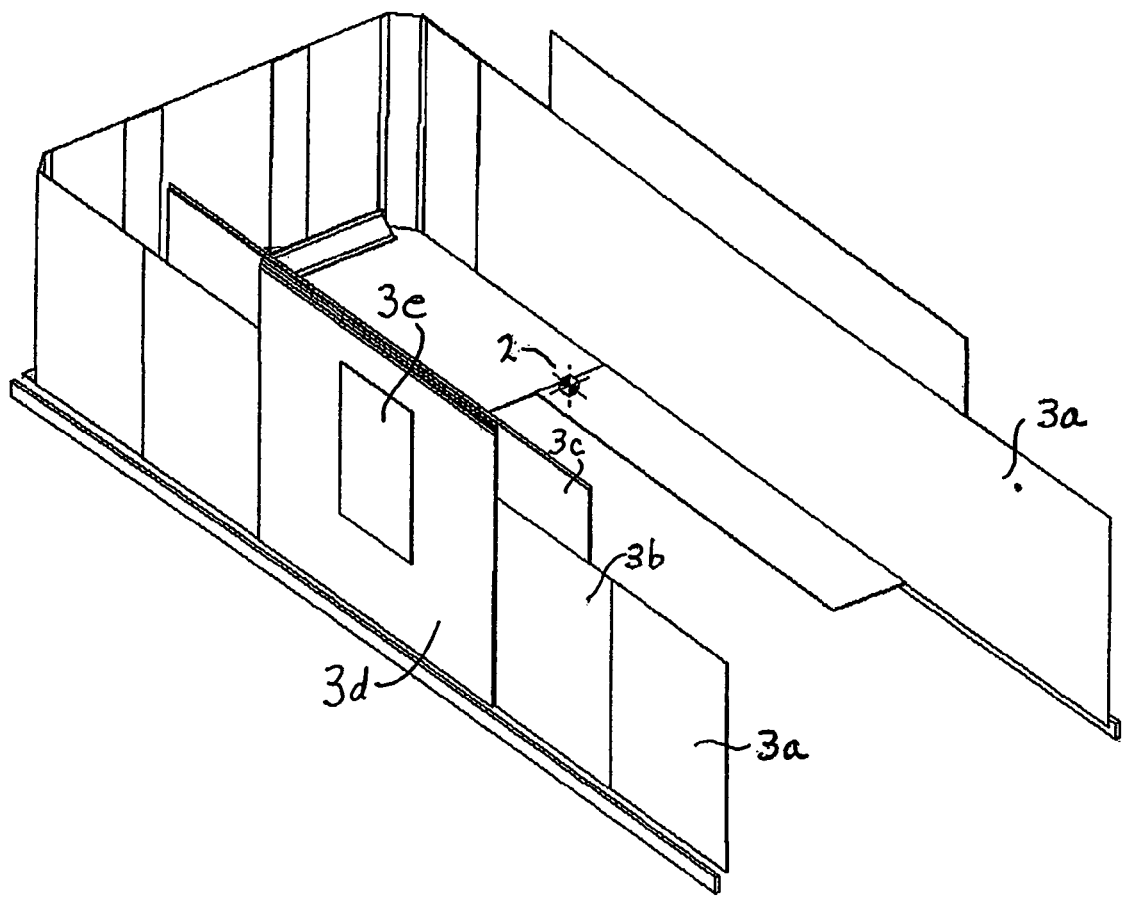
FIG. 3 shows an example of reverse lay-up of shielding layers according to the present invention.
Figure 4:
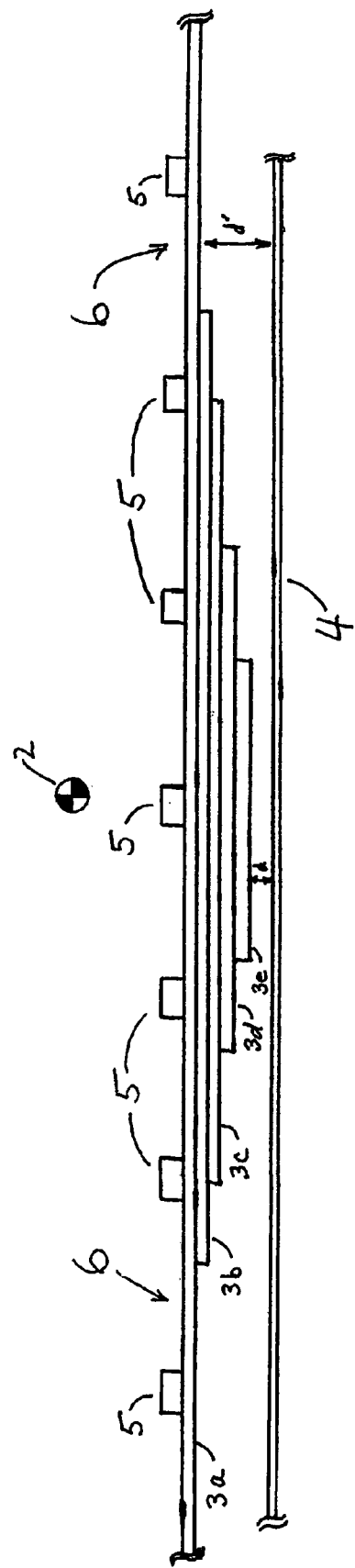
FIG. 4 is a cross sectional schematic view of the layer structure according to the invention.
Figure 5:
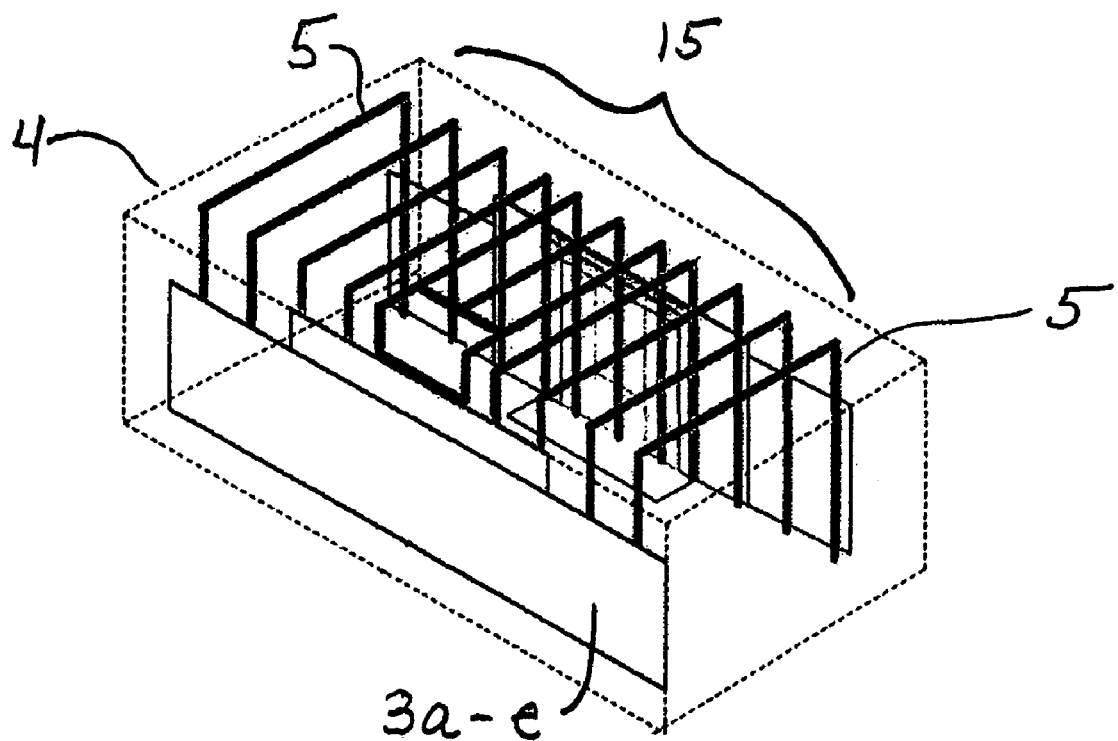
FIG. 5 is a schematic perspective depiction of the support frame for the shielding layers according to the invention.

FIGS. 3–5 depict an example of the shielding arrangement according to the present invention, which differs from the conventional shielding of FIGS. 1 and 2 in both the manner in which the shielding layers are supported and in the manner in which they are stacked. FIG. 3, in particular, is a schematic perspective view which corresponds to FIG. 1, and shows the layers of shielding material stacked with laterally longest layer 3a facing inward and the shorter layers 3b–3e disposed outwardly of the longest layer, toward the outer wall of the trailer (not shown).

As best seen in FIG. 4, with the reverse arrangement of the shielding layers 3a–3e (compared to FIG. 2), the laterally longest layer 3a being positioned farthest from the outer wall 4, the shielding is separated from the outer wall at the extremities 6 of the shielding, by a gap d' which is greater than the gap d that exists along the entire length of the trailer according to the prior art in FIG. 2. In fact, as can be seen from FIG. 4, the gap width is greater than d over the length of the trailer, with the exception of the relatively small area close to the isocenter 2 of the magnetic field, where the stack of magnetic shielding steel layers is thickest.

In addition, as also shown schematically in FIG. 4, the stack of shielding layers according to the invention is supported independently of the outer walls of the trailer, by inflexible frame members 5, which may be made for example, of stainless steel. FIG. 5 is a schematic depiction of the rigid support frame 15 which is made up of individual rigid frame members 5, supporting the shielding layers (not shown individually), which are in turn surrounded by, but not supported on, the exterior trailer walls 4.

With the shielding supported independently of the trailer outer walls in this manner, the gap d, d' between the shielding layers 3a–e and trailer outer wall 4 is less subject to distortion due to mechanical stress, than is the conventional arrangement in which the shielding is supported on the trailer wall. This feature, combined with the wider gap created by stacking of the shielding layers in reverse order, helps to maintain and ensure physical isolation between the outer walls 4 and shielding layers 3a–e under torsion loads, when the trailer is placed on uneven ground or is deformed by differential thermal expansion, effects of wind or other environmental influences.

An embodiment including the combination of support frame members 5 and reverse arrangement of the shielding layers 3a–e has been demonstrated to create an environment for the MRI scanner that is independent of external weather conditions, and has enabled the full performance of advanced MRI systems to become available in a mobile installation for the first time.

The inflexible independent support frame 15 for the shielding layers ensures that the shielding does not move relative to the magnet, despite deformation of the trailer of other housing in which the shielding is placed. The reverse arrangement of the shielding layers allows greater physical separation between the extremities of the magnetic shielding and the wall of the deformable housing, reducing the likelihood of the housing deforming to such an extent that the magnetic shielding is deformed.

Alternative embodiments may include a range of materials, including ferrous materials, for the inflexible support frame 5. Thermal insulation may be provided between the outer walls or roof and the shielding steel, and the structure may be strengthened by welding the shielding layers together. The order of the "reverse" arrangement of the layers could be in any order to suit the requirements of the trailer, provided that the sheets of magnetic material which contain the extremities of the shielding (that is, the longest layers) are located inboard of the majority of the other sheets of magnetic material. Likewise, shielding layers could be mounted to the inner or outer surface of the support frame. The frame for mounting the magnetic shielding may itself be mounted onto the magnet system of the MRI system, giving an all-in-one, 'magnet in a box' solution.

Embodiments of the design could apply to static installations, where control of the stray field and isolation from external thermal and mechanical influences are required.

The invention may be applied to installations within any deformable housing, such as road trailers, prefabricated buildings and the like.

The invention accordingly provides an environment for mobile MRI scanners that is isolated from external weather conditions, and enables the full performance of advanced MRI systems to become available in a mobile installation. The invention achieves this by providing magnetic shielding mounted on an inflexible support frame which is independent of the deformable housing, such as a road trailer. A reverse arrangement of shielding layers may be employed to increase the physical separation between the extremities of the magnetic shielding and the wall of the deformable housing.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A magnetic shielding arrangement for a magnetic field generating apparatus which is mounted in a deformable housing defined by exterior walls, said shielding arrangement comprising:
   a plurality of layers of magnetic material arranged in a stack; and
   a rigid frame which supports said layers within the deformable housing, independently of said exterior walls.

2. The magnetic shield arrangement according to claim 1, wherein said magnetic field generating apparatus is a magnetic resonance imaging device.

3. The magnetic shielding arrangement according to claim 2, wherein the rigid frame is substantially composed of stainless steel.

4. The magnetic shielding arrangement according to claim 3, wherein at least some of the layers of magnetic material are welded together.

5. The magnetic shielding arrangement according to claim 2, wherein the layers of magnetic material are arranged with a laterally longest layer, which contains the extremities of the shielding, being located inboard of other layers of magnetic material.

6. The magnetic shield arrangement according to claim 5, wherein the layers are stacked with successively shorter layers in an inward direction, toward an interior of the deformable housing.

7. A deformable housing for enclosing a magnetic field generating apparatus, said housing comprising:
   exterior walls;
   a plurality of layers of magnetic material arranged in a stack; and
   a rigid frame which supports said layers within the deformable housing, independently of said exterior walls.

8. The deformable housing according to claim 7, wherein said magnetic field generating apparatus is a magnetic resonance imaging device.

9. The deformable housing according to claim 8, wherein the rigid frame is substantially composed of stainless steel.

10. The deformable housing according to claim 9, wherein at least some of the layers of magnetic material are welded together.

11. The deformable housing according to claim 8, wherein the layers of magnetic material are arranged with a laterally longest layer, which contains the extremities of the shielding, being located inboard of other layers of magnetic material.

12. A deformable housing according to claim 11, further comprising thermal insulation between the layers of magnetic material and at least one of outer walls and a roof of the deformable housing.

13. A magnetic resonance imaging system, comprising:
a deformable housing; and
a magnetic resonance imager mounted in said deformable housing; wherein said deformable housing comprises, exterior walls;
a plurality of layers of magnetic material arranged in a stack; and
a rigid frame which supports said layers within the deformable housing, independently of said exterior walls.

14. The deformable housing according to claim 13, wherein the rigid frame is substantially composed of stainless steel.

15. The deformable housing according to claim 14, wherein at least some of the layers of magnetic material are welded together.

16. The deformable housing according to claim 13, wherein the layers of magnetic material are arranged with a laterally longest layer, which contains the extremities of the shielding, being located inboard of other layers of magnetic material.

17. A deformable housing according to claim 16, further comprising thermal insulation between the layers of magnetic material and at least one of outer walls and a roof of the deformable housing.

* * * * *